United States Patent
Cha et al.

(10) Patent No.: US 9,537,051 B2
(45) Date of Patent: Jan. 3, 2017

(54) NANOSTRUCTURE SEMICONDUCTOR LIGHT EMITTING DEVICE

(71) Applicant: Samsung Electronics Co., Ltd., Suwon-si, Gyeonggi-do (KR)

(72) Inventors: Nam Goo Cha, Hwaseong-si (KR); Jin Bock Lee, Hwaseong-si (KR); Dong Kuk Lee, Suwon-si (KR); Dong Hyun Cho, Hwaseong-si (KR); Min Wook Choi, Gimpo-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/838,635

(22) Filed: Aug. 28, 2015

(65) Prior Publication Data

US 2016/0064609 A1    Mar. 3, 2016

(30) Foreign Application Priority Data

Aug. 29, 2014    (KR) .................. 10-2014-0114199

(51) Int. Cl.
*H01L 33/00* (2010.01)
*H01L 33/24* (2010.01)
(Continued)

(52) U.S. Cl.
CPC .............. *H01L 33/24* (2013.01); *H01L 33/08* (2013.01); *H01L 33/0075* (2013.01); *H01L 33/38* (2013.01);
(Continued)

(58) Field of Classification Search
CPC .......... H01L 33/04; H01L 33/08; H01L 33/20; H01L 33/24
(Continued)

(56) References Cited

U.S. PATENT DOCUMENTS 6,372,608 B1    4/2002    Shimoda et al.
6,645,830 B2    11/2003   Shimoda et al.
(Continued)

FOREIGN PATENT DOCUMENTS

JP    2009-542560 A    12/2009
JP    2011-527519 A    10/2011
(Continued)

*Primary Examiner* — Brook Kebede
(74) *Attorney, Agent, or Firm* — Harness, Dickey & Pierce, PLC

(57) ABSTRACT

A nanostructure semiconductor light emitting device may include a base layer having first and second regions and formed of a first conductivity-type semiconductor material; a plurality of light emitting nanostructures disposed on the base layer, each of which including a nanocore formed of a first conductivity-type semiconductor material, and an active layer and a second conductivity-type semiconductor layer sequentially disposed on the nanocore; a contact electrode disposed on the light emitting nanostructures to be connected to the second conductivity-type semiconductor layer; a first electrode connected to the base layer; and a second electrode covering a portion of the contact electrode disposed on at least one of light emitting nanostructures disposed in the second region among the plurality of light emitting nanostructures, wherein light emitting nanostructures disposed in the second region and light emitting nanostructures disposed in the first region among the plurality of light emitting nanostructures have different shapes.

19 Claims, 17 Drawing Sheets

(51) Int. Cl.
*H01L 33/08* (2010.01)
*H01L 33/38* (2010.01)

(52) U.S. Cl.
CPC .............. *H01L 2933/0016* (2013.01); *H01L 2933/0025* (2013.01)

(58) Field of Classification Search
USPC ............................................ 257/13, 98–100
See application file for complete search history.

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,426,224 B2 | 4/2013 | Wang et al. |
| 8,432,511 B2 | 4/2013 | Jeong |
| 8,435,818 B2 | 5/2013 | Wei et al. |
| 8,459,832 B2 | 6/2013 | Kim |
| 8,502,242 B2 | 8/2013 | Kim |
| 8,536,604 B2 | 9/2013 | Kwak et al. |
| 8,669,125 B2 | 3/2014 | Lowgren |
| 8,735,931 B2 | 5/2014 | Han et al. |
| 8,766,295 B2 | 7/2014 | Kim |
| 2005/0011431 A1 | 1/2005 | Samuelson et al. |
| 2008/0036038 A1 | 2/2008 | Hersee et al. |
| 2011/0062453 A1 | 3/2011 | Armitage |
| 2011/0254034 A1 | 10/2011 | Konsek et al. |
| 2012/0061641 A1 | 3/2012 | Seong et al. |
| 2012/0164767 A1 | 6/2012 | Gasse et al. |
| 2012/0305966 A1 | 12/2012 | Shin |
| 2013/0313514 A1 | 11/2013 | Hwang et al. |
| 2014/0203240 A1* | 7/2014 | Hwang ................... H01L 33/08 257/13 |
| 2014/0209859 A1* | 7/2014 | Cha ........................ H01L 33/005 257/13 |
| 2014/0217357 A1 | 8/2014 | Yoo et al. |
| 2014/0246647 A1 | 9/2014 | Cha et al. |

FOREIGN PATENT DOCUMENTS

| | | |
|---|---|---|
| JP | 5097460 B2 | 12/2012 |
| JP | 5145120 B2 | 2/2013 |
| KR | 10-0658938 B1 | 12/2006 |
| KR | 10-1108998 B1 | 2/2012 |
| KR | 10-2012-0028104 A | 3/2012 |
| KR | 10-2012-0059064 A | 6/2012 |
| KR | 10-2012-0133961 A | 12/2012 |
| KR | 10-2013-0131217 A | 12/2013 |
| KR | 10-2014-0093433 A | 7/2014 |
| KR | 10-2014-0096980 A | 8/2014 |

* cited by examiner

NANOSTRUCTURE SEMICONDUCTOR LIGHT EMITTING DEVICE

CROSS-REFERENCE TO RELATED APPLICATION

This application claims the priority to Korean Patent Application No. 10-2014-0114199 filed on Aug. 29, 2014, with the Korean Intellectual Property Office, the disclosure of which is incorporated herein by reference.

TECHNICAL FIELD

The present disclosure relates to a nanostructure semiconductor light emitting device.

BACKGROUND

A semiconductor light emitting device such as a light emitting diode (LED) is a device including a material that emits light, in which energy generated through electron-hole recombination is converted into light to be emitted therefrom. LEDs are commonly used as light sources in lighting devices, display devices, and the like, and the development of LEDs has thus been accelerated.

In recent years, semiconductor light emitting devices using nanostructures and technologies for manufacturing the same have been proposed to improve crystallinity and/or luminous efficiency. In such a semiconductor light emitting device using nanostructures, the generation of heat may be relatively reduced or prevented a surface area may be increased due to the use of nanostructures and/or a light emitting area may be increased to enhance luminous efficiency. In addition, an active layer may be obtained from a non-polar plane or a semi-polar plane, whereby luminous efficiency resulting from polarization may be reduced or prevented and efficiency droop characteristics may be improved.

However, such nanostructures may be formed as long nanorods, and may be easily broken in the manufacturing process of the semiconductor light emitting device. In a case in which the nanostructures are broken, leakage current may be increased, resulting in an increased operating voltage of the semiconductor light emitting device.

SUMMARY

An example embodiment in the present disclosure may provide a nanostructure semiconductor light emitting device having more stable operating characteristics by reducing or preventing nanostructures from being easily broken in the manufacturing process.

According to an example embodiment in the present disclosure, a nanostructure semiconductor light emitting device may include: a base layer having first and second regions and formed of a first conductivity-type semiconductor material; a plurality of light emitting nanostructures disposed on the base layer, each of which including a nanocore formed of a first conductivity-type semiconductor material, and an active layer and a second conductivity-type semiconductor layer sequentially disposed on the nanocore; a contact electrode disposed on the plurality of light emitting nanostructures to be electrically connected to the second conductivity-type semiconductor layer; a first electrode electrically connected to the base layer; and a second electrode covering a portion of the contact electrode disposed on at least one of light emitting nanostructures disposed in the second region among the plurality of light emitting nanostructures, wherein the light emitting nanostructures disposed in the second region and light emitting nanostructures disposed in the first region among the plurality of light emitting nanostructures may have different shapes.

The light emitting nanostructures disposed in the second region may have a larger diameter than the light emitting nanostructures disposed in the first region.

The light emitting nanostructures disposed in the second region may be shorter than the light emitting nanostructures disposed in the first region.

The light emitting nanostructures disposed in the second region may have a larger pitch than the light emitting nanostructures disposed in the first region.

The light emitting nanostructures disposed in the second region may have a lower aspect ratio than the light emitting nanostructures disposed in the first region.

The aspect ratio of the light emitting nanostructures disposed in the second region may be less than the aspect ratio of the light emitting nanostructures disposed in the first region by at least 10%.

The second region may include a region covered with the second electrode and a peripheral region adjacent thereto.

The peripheral region may be disposed to have a predetermined (or alternatively, given) width around the region covered with the second electrode.

The predetermined (or alternatively, given) width may be less than approximately 5 µm.

Light emitting nanostructures disposed in the peripheral region may have a smaller diameter than the light emitting nanostructures disposed in the region covered with the second electrode.

Light emitting nanostructures disposed in the peripheral region may be shorter than the light emitting nanostructures disposed in the region covered with the second electrode.

The nanostructure semiconductor light emitting device may further include an insulating protective layer filling spaces between the plurality of light emitting nanostructures, wherein the insulating protective layer may be disposed on the first region.

An active layer included in each of the light emitting nanostructures disposed in the second region may be thinner than an active layer included in each of the light emitting nanostructures disposed in the first region.

A second conductivity-type semiconductor layer included in each of the light emitting nanostructures disposed in the second region may be thicker than a second conductivity-type semiconductor layer included in each of the light emitting nanostructures disposed in the first region.

According to another example embodiment in the present disclosure, a nanostructure semiconductor light emitting device may include: a base layer formed of a first conductivity-type semiconductor material and having a first region and a second region disposed around the first region and spaced apart from the first region; a plurality of light emitting nanostructures disposed on the base layer to be spaced apart from each other, each of which including a nanocore formed of a first conductivity-type semiconductor material, and an active layer and a second conductivity-type semiconductor layer sequentially disposed on the nanocore; a contact electrode disposed on the plurality of light emitting nanostructures; a first electrode electrically connected to the base layer; and a second electrode covering a portion of the contact electrode corresponding to the first region, wherein light emitting nanostructures disposed in the first region and light emitting nanostructures disposed in the second region among the plurality of light emitting nanostructures may have different shapes.

According to another example embodiment in the present disclosure, a nanostructure semiconductor light emitting device may comprise: a base layer including first and second regions; a plurality of light emitting nanostructures on an upper surface of the base layer; and a contact electrode on the plurality of light emitting nanostructures, wherein the light emitting nanostructures in the second region and light emitting nanostructures in the first region among the plurality of light emitting nanostructures have different shapes.

The light emitting nanostructures in the second region may have a lower aspect ratio than the light emitting nanostructures in the first region.

The nanostructure semiconductor light emitting device may further comprise: an insulating protective layer filling spaces between the plurality of light emitting nanostructures, wherein the insulating protective layer is in the first region.

In the nanostructure semiconductor light emitting device, an active layer of each of the light emitting nanostructures in the second region may be thinner than an active layer of each of the light emitting nanostructures in the first region.

The nanostructure semiconductor light emitting device may further include a conductivity-type semiconductor layer of each of the light emitting nanostructures in the second region is thicker than a conductivity-type semiconductor layer of each of the light emitting nanostructures in the first region.

BRIEF DESCRIPTION OF DRAWINGS

The above and other aspects, features and advantages in the present disclosure will be more clearly understood from the following detailed description taken in conjunction with the accompanying drawings, in which.

DETAILED DESCRIPTION

Figure 1:
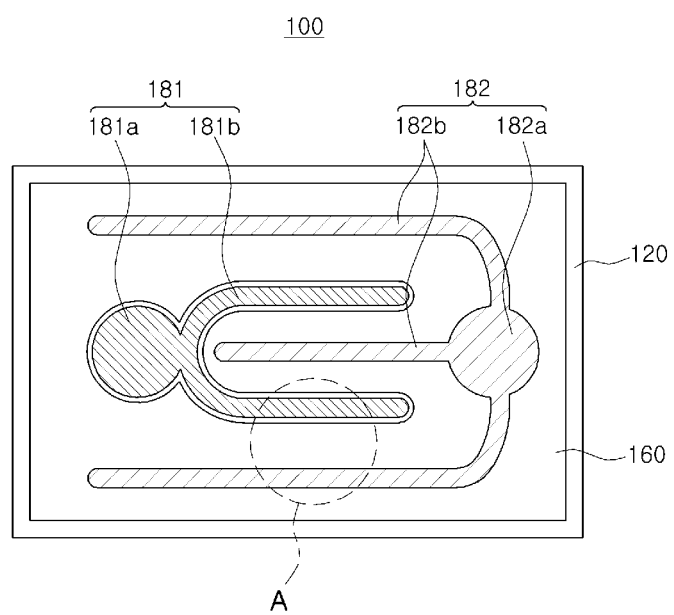
FIG. 1 is a plan view of a nanostructure semiconductor light emitting device according to an example embodiment in the present disclosure.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, example embodiments in the detailed description will be described with sectional views as ideal example views of the inventive concepts. Accordingly, shapes of the example views may be modified according to manufacturing techniques and/or allowable errors. Therefore, example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

A nanostructure semiconductor light emitting device 100 according to an example embodiment in the present disclosure will be described.

Figure 2:
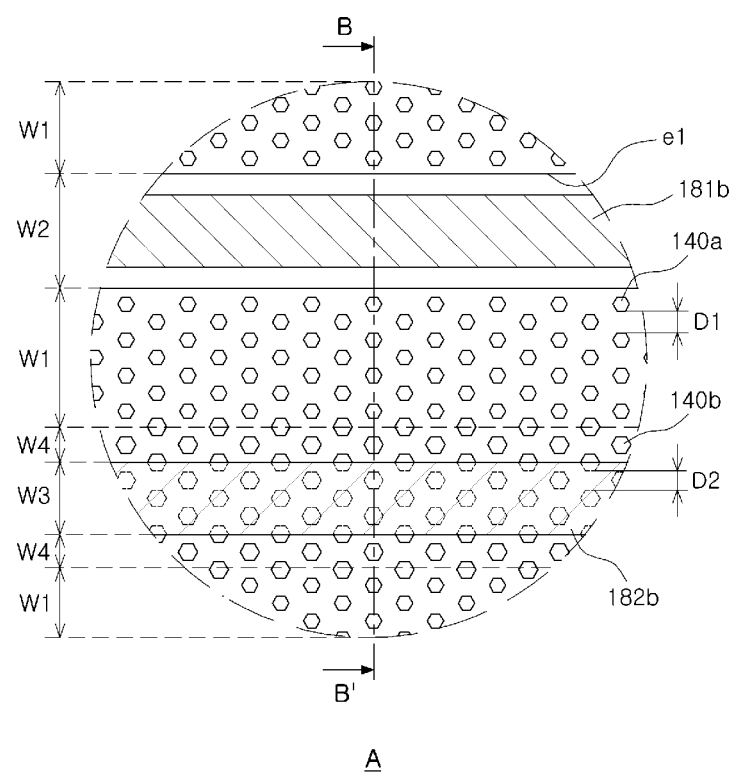
FIG. 2 is an enlarged view of portion A in the nanostructure semiconductor light emitting device of FIG. 1.
Figure 3:
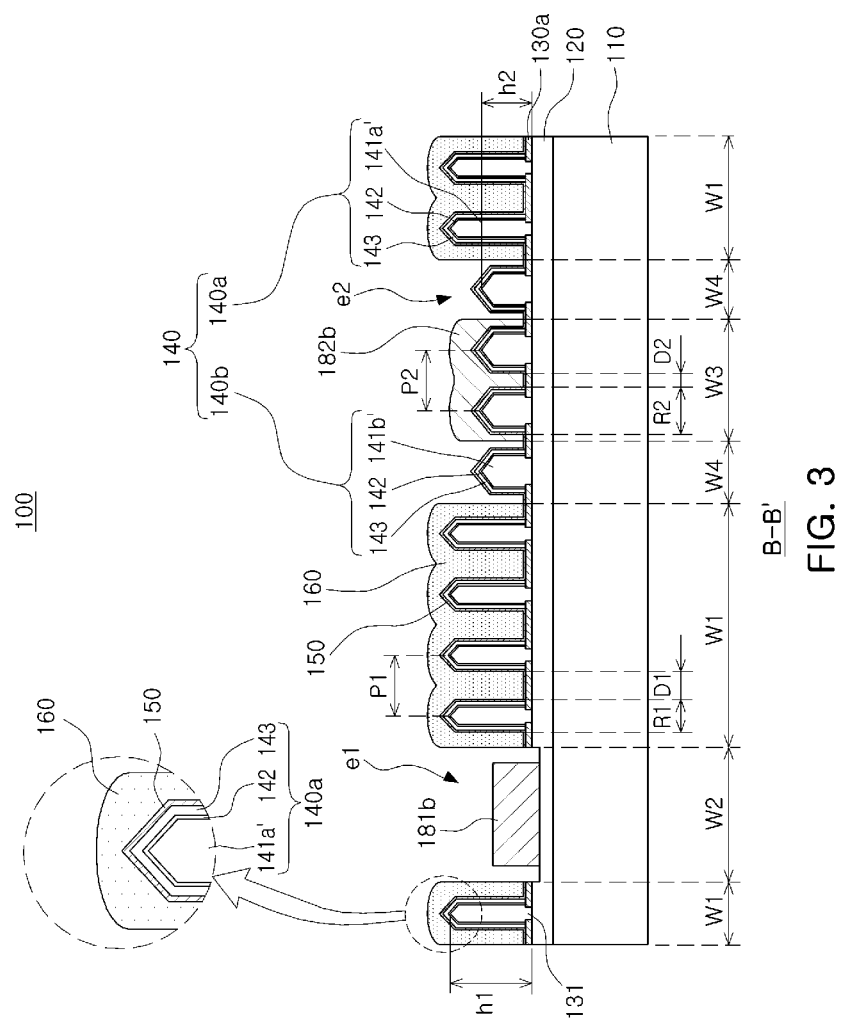
FIG. 3 is a cross-sectional view of the nanostructure semiconductor light emitting device of FIG. 2, taken along line B-B'.

FIG. 1 is a plan view of a nanostructure semiconductor light emitting device according to an example embodiment in the present disclosure; FIG. 2 is an enlarged view of portion A in the nanostructure semiconductor light emitting device of FIG. 1; and FIG. 3 is a cross-sectional view of the nanostructure semiconductor light emitting device of FIG. 2, taken along line B-B'. To allow for a better understanding of the device, FIGS. 2 and 3 are views of device portions enlarged and reduced as compared to FIG. 1, rather than being to the same scale.

As illustrated in FIGS. 1 through 3, the nanostructure semiconductor light emitting device 100 according to the present example embodiment may include a base layer 120 formed of a first conductivity-type semiconductor material, a plurality of light emitting nanostructures 140 disposed on the base layer 120, and a contact electrode 150 disposed on the plurality of light emitting nanostructures 140.

The base layer 120 may be formed on a substrate 110. The base layer 120 may provide a growth surface for the plurality of light emitting nanostructures 140, and may serve to form electrical connections between portions of the light emitting nanostructures 140 having the same polarity.

The base layer 120 may have a first region W1 and second regions W2, W3 and W4. The first region W1 may be defined as a region that receives electrical signals to emit light externally, while the second regions W2, W3 and W4 may be defined as regions that do not emit light externally even when electrical signals are applied thereto, including a region W2 disposed below a first electrode 181, a region W3 disposed below a second electrode 182b, and a region W4 adjacent thereto.

The substrate 110 may be an insulating substrate, a conductive substrate, or a semiconductor substrate. For example, the substrate 110 may be formed of sapphire, SiC, Si, $MgAl_2O_4$, MgO, $LiAlO_2$, $LiGaO_2$ or GaN. The base layer 120 may be formed of a nitride semiconductor containing $Al_xIn_yGa_{1-x-y}N$ ($0\leq x\leq1$, $0\leq y<1$, $0\leq x+y<1$), and may be doped with impurities to have a particular conductivity-type. For example, the base layer 120 may be doped with n-type impurities such as silicon (Si).

A first material layer 130a may be formed as an insulating layer having openings 131 on the base layer 120, and the openings may be provided for growth of the light emitting nanostructures 140, especially nanocores 141a' and 141b'. Portions of the base layer 120 may be exposed through the openings 131 and the nanocores 141a' and 141b' may be formed on the exposed portions of the base layer 120. The first material layer 130a may be used as a mask for growth of the nanocores 141a' and 141b'. The first material layer 130a may be formed of an insulating material such as $SiO_2$, SiN, $TiO_2$, $Si_3N_4$, $Al_2O_3$, TiN, AlN, $ZrO_2$, TiAlN, or TiSiN that may be used in a semiconductor process.

Each of the light emitting nanostructures 140 may have a core-shell structure including the nanocore 141a' or 141b' formed of a first conductivity-type semiconductor material, and a shell layer formed of an active layer 142 enclosing the nanocore 141a' or 141b' and a second conductivity-type semiconductor layer 143.

The nanocores 141a' and 141b' may be formed of a first conductivity-type semiconductor material, and the first conductivity-type semiconductor material may be an n-type nitride semiconductor. For example, the nanocores 141a' and 141b' may be crystals containing n-type $Al_xIn_yGa_{1-x-y}N$ ($0\leq x<1$, $0\leq y<1$, $0\leq x+y<1$). The first conductivity-type semiconductor material forming the nanocores 141a' and 141b' may be the same as the first conductivity-type semiconductor material forming the base layer 120. For example, the base layer 120 and the nanocores 141a' and 141b' may be formed of n-type GaN. In addition, the nanocores 141a' and 141b' may be provided in the form of nanorods having lengths greater than diameters.

The active layer 142 may have a multi-quantum well (MQW) structure in which quantum well layers and quantum barrier layers are alternately stacked. For example, in the case in which the active layer 142 is formed of a nitride semiconductor, it may have a GaN/InGaN MQW structure. Alternatively, the active layer 142 may have a single quantum well (SQW) structure. The second conductivity-type semiconductor layer 143 may be a crystal containing p-type $Al_xIn_yGa_{1-x-y}N$ ($0\leq x<1$, $0\leq y<1$, $0\leq x+y<1$).

The active layer 142 may be formed to cover side and top surfaces of the nanocores 141a' and 141b'. In the present example embodiment, the active layer 142 may be formed on the surfaces of the nanocores 141a' and 141b' in a single process. In an example embodiment in which the nanocores 141a' and 141b' have different heights or different diameters, the active layers 142 formed thereon may have different compositions due to differences in lattice constants, specific surface areas and strain forces, even when formed under the same processing conditions, whereby the wavelengths of light generated in the light emitting nanostructures 140 may differ.

For example, in a case in which the composition of the quantum well layers forming the active layer 142 satisfies $In_xGa_{1-x}N$ ($0 \leq x \leq 1$), the content of indium (In) may differ according to nanocores having different diameters or different heights. As a result, the wavelengths of light emitted from respective quantum well layers may differ. The active layer 142 may be formed to have a thickness of approximately 1 nm, which may be the minimum thickness of the quantum well generating the quantum confinement effect so as to emit light. In this regard, the thickness of the quantum well may be appropriately selected within a range of approximately 1 nm to 15 nm in consideration of wavelength changes. In an example embodiment, by adjusting the thicknesses of the active layers 142 formed on some of the nanocores to be out of the above range, corresponding light emitting nanostructures may not emit light.

Such light emitting nanostructures 140 may be formed as nanorods having a high aspect ratio, in which the height thereof is greater than the diameter thereof, by reflecting the shapes of the nanocores 141a'. Therefore, the light emitting nanostructures 140 may be easily broken due to external impact during the manufacturing process. In a case in which the light emitting nanostructures 140 are broken during the manufacturing process, the base layer 120 formed of the first conductivity-type semiconductor material may be exposed, causing leakage current.

In order to solve the aforementioned problem, an insulating protective layer 160 may fill spaces between the light emitting nanostructures 140, thereby protecting the light emitting nanostructures 140 from external impact. However, in order to form the second electrode 182 on the light emitting nanostructures 140, wet-etching and removing a portion of the insulating protective layer 160 may be necessary. At this time, due to the properties of an etchant used in the wet-etching process, the region W3 in which the second electrode 182 is to be formed and a portion of the insulating protective layer 160 adjacent thereto may be removed to thereby define the region W4. The light emitting nanostructures 140 disposed on the region W4 may be vulnerable to external impact since the insulating protective layer 160 has been removed and even the second electrode 182 is not formed.

In order to solve the aforementioned problem, the following method has been considered: the light emitting nanostructures 140 are not formed in the region W3, in which the second electrode 182 is to be formed, and in the region W4. However, in a case in which the light emitting nanostructures 140 are not disposed therein, the distribution of source gases supplied during the manufacturing process may be changed, resulting in changes in the content of In in the active layers formed on the nanocores disposed adjacent to the regions W3 and S4. Therefore, the wavelengths of light emitted from the light emitting nanostructures 140 may be changed.

In order to solve the aforementioned problem, the light emitting nanostructures 140 disposed in the region W3, in which the second electrode is to be formed, and in the region W4 may be formed to be resistant to external impact. As examples of such impact-resistant nanostructures, nanostructures being relatively short or having relatively large diameters may be used; however, the present inventive concept is not limited thereto.

Details of the light emitting nanostructures 140 will be provided below. As illustrated in FIGS. 2 and 3, the light emitting nanostructures 140 may be disposed in the first region W1 and the second regions W3 and W4 of the base layer 120, and may have different shapes in the first and second regions. The light emitting nanostructures 140 disposed in the first region W1 may be removed to form the first electrode 181, and details thereof will be omitted.

Specifically, a diameter R2 of each of a plurality of light emitting nanostructures 140b disposed in the second regions W3 and W4 may be greater than a diameter R1 of each of a plurality of light emitting nanostructures 140a disposed in the first region W1.

In order to increase the diameter R2 of the light emitting nanostructure 140b, the diameter of the nanocore 141b' may be increased or the thickness of second conductivity-type semiconductor layer 143 may be increased. The diameter of the nanocore 141b' may be adjusted according to the size of the opening 131 formed in the first material layer 130a, which serves as a mask for the growth of the nanocore 141b'. Thus, as the size of the opening 131 is increased, the diameter of the nanocore 141b' may be increased.

By increasing the diameter of the nanocore 141b', when an aspect ratio of the light emitting nanostructure 140b obtained by dividing a height h2 thereof by the diameter R2 is reduced by approximately 10%, the volume of the light emitting nanostructure 140b is increased by 20% or greater. Since the volume and diameter R2 of the light emitting nanostructure 140b are increased, the light emitting nanostructure 140b may be more resistant to external impact as compared with the light emitting nanostructure 140a disposed in the first region W1.

The aspect ratio of the light emitting nanostructure 140b may be reduced by reducing the height h2 thereof. By maintaining a distance D2 between adjacent light emitting nanostructures 140b and increasing the diameters of the openings 131, a pitch P2 between the light emitting nanostructures 140b may be increased, and thus, a growth rate of the light emitting nanostructures 140b may be lowered in a length direction thereof, whereby the light emitting nanostructure 140b may be formed to be relatively thick and short. In addition, by reducing the distance D2 between the light emitting nanostructures 140b, a greater amount of light emitting nanostructures 140b may be formed in the same area, and thus, the growth rate of the light emitting nanostructures 140b may be lowered in the length direction. Therefore, the light emitting nanostructures 140b may be formed to have the same diameter, but may be relatively short.

In example embodiments, the diameters or heights of the light emitting nanostructures 140b may be adjusted to differ according to the second regions W3 and W4. For example, the diameter of the light emitting nanostructure 140b disposed in the region W3 may be larger than the diameter of the light emitting nanostructure 140b disposed in the region W4, or the height of the light emitting nanostructure 140b disposed in the region W3 may be less than the height of the light emitting nanostructure 140b disposed in the region W4. In example embodiments, the light emitting nanostructures 140a and 140b may be arranged in a manner such that the diameters thereof are gradually increased from the first region W1 toward the second region W3 or the heights thereof are gradually reduced from the first region W1 toward the second region W3. By gradually changing the shapes of the light emitting nanostructures 140a and 140b, a radical change in the shapes of the light emitting nanostructures 140a and 140b may be alleviated, and thus, the adhesion of the contact electrode 150 or the insulating protective layer 160 disposed on the light emitting nanostructures 140a or 140b may be increased.

In addition, in a case in which the pitch P2 between the light emitting nanostructures 140b is increased, it may be easy to form the electrode on the plurality of light emitting nanostructures 140b. For example, in a case in which the pitch P2 between the light emitting nanostructures 140b disposed in the region W3 is increased, when the second electrode 182 is formed on the light emitting nanostructures 140b in a subsequent process, it may be easy to fill the region W3 with metal particles, whereby the separation of the second electrode 182 from the light emitting nanostructures 140b may be reduced or prevented. In a case in which the second electrode 182 is entirely separated from the light emitting nanostructures 140b, the nanostructure semiconductor light emitting device 100 may fail to emit light. In a casein which the second electrode 182 is partially separated from the light emitting nanostructures 140b, a contact area between the second electrode 182 and the contact electrode 150 may be reduced, causing a problematic increase in the operating voltage of the nanostructure semiconductor light emitting device 100.

In example embodiments in which the plurality of light emitting nanostructures 140b disposed in the region W3 below the finger portion 182b of the second electrode 182 and the region W4 adjacent thereto and the plurality of light emitting nanostructures 140a disposed in the region W1 are formed to have different shapes, the active layers 142 formed thereon may be changed, thereby emitting light having different wavelengths. In example embodiments, since the active layers 142 are designed to be optimized for the nanocores 141a' disposed in the region W1, light of an undesired wavelength may be emitted from the active layers 142 in the regions W3 and W4.

In order to solve the aforementioned problem, the active layers 142 in the regions W3 and W4 may be formed to be relatively thick so as to not emit light by failing to generate the quantum confinement effect. In example embodiments, the active layers 142 in the regions W3 and W4 may emit light, but the emitted light may be reduced or prevented from affecting light emitted from the entirety of the nanostructure semiconductor light emitting device 100. Since the light emitting nanostructures 140b in the regions W3 and W4 include the nanocores having relatively large diameters as compared with those included in the light emitting nanostructures 140a in the region W1, the active layers in the regions W3 and W4 may be relatively thin and have a low In composition ratio. Therefore, the active layers in the regions W3 and W4 may emit relatively long-wavelength light. Such relatively long-wavelength light may have little effect on human eyesight. In addition, since a total area of the regions W3 and W4 is relatively smaller than a total areal of the region W1, even when light having different wavelengths is emitted from the light emitting nanostructures in the regions W3 and W4, the emitted light may have an insignificant effect on the light emitted from the entirety of the nanostructure semiconductor light emitting device 100.

As illustrated in FIG. 3, the contact electrode 150 may be disposed on the surfaces of the light emitting nanostructures 140. The contact electrode 150 may be formed of an ohmic-contact material having ohmic contact with the second conductivity-type semiconductor layers 143. For example, the contact electrode 150 may include at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au), and may be provided as a single layer or a plurality of layers. Alternatively, the contact electrode 150 may include a transparent electrode material such as indium tin oxide (ITO). As necessary, ZnO or graphene may also be used therefor.

In addition, in order to thoroughly reduce or prevent the active layers 142 in the regions W3 and W4 from emitting light, a current blocking layer (not shown) may be further interposed between the contact electrode 150 and the second conductivity-type semiconductor layers 143 in the regions W3 and W4. The current blocking layer may include an insulating layer such as $SiO_2$, SiN, $Al_2O_3$, HfO, $TiO_2$ or ZrO, and may serve to block current between the light emitting nanostructures 140 and the contact electrode 150, thereby fundamentally reducing or preventing the active layers 142 of the light emitting nanostructures 140b disposed in the regions W3 and W4 from emitting light.

In addition, in order to reduce or prevent ohmic contact between the surfaces of the light emitting nanostructures 140b disposed in the regions W3 and W4 and the contact electrode 150, the surfaces of the light emitting nanostructures 140b may be heat-treated, may be doped with Mg, or may be implanted with hydrogen ions.

The insulating protective layer 160 may be provided to fill the spaces between the light emitting nanostructures 140a while covering the light emitting nanostructures 140a. The insulating protective layer 160 may serve as a support for firmly maintaining the light emitting nanostructures 140a, and may be formed of an electrical insulating material that is able to provide a passivation structure through a semiconductor process. The insulating protective layer 160 may be a protective layer including an insulating material such as $SiO_2$ or $SiN_x$. For example, the insulating protective layer 160 may be formed of tetraethylorthosilane (TEOS), borophospho silicate glass (BPSG), $CVD-SiO_2$, spin-on glass (SOG), or spin-on delectric (SOD), so as to fill the spaces between the light emitting nanostructures 140a with ease.

The insulating protective layer 160 may be formed to have a uniform thickness on the light emitting nanostructures 140a disposed in the region W1.

As illustrated in FIG. 1, the nanostructure semiconductor light emitting device 100 may include the first and second electrodes 181 and 182. In addition, as illustrated in FIG. 3, the first electrode 181 may be disposed on the exposed portion of the base layer 120 formed of the first conductivity-type semiconductor material, while the second electrode 182 may be disposed on the region W3 in which the contact electrode 150 is exposed.

In FIG. 1, the first electrode 181 and the second electrode 182 may have pad portions 181a and 182a and one or more finger portions 181b and 182b extending from the pad portions 181a and 182a, respectively. However, the electrodes are not limited thereto, and may be modified in various forms.

The nanostructure semiconductor light emitting device 100 having the aforementioned structure may be obtained by using various manufacturing methods. FIGS. 4 through 13 are views illustrating sequential processes in a method of manufacturing the nanostructure semiconductor light emitting device of FIG. 1.

According to the present manufacturing method, the base layer 120 may be prepared by using a first conductivity-type semiconductor material.

Figure 4:
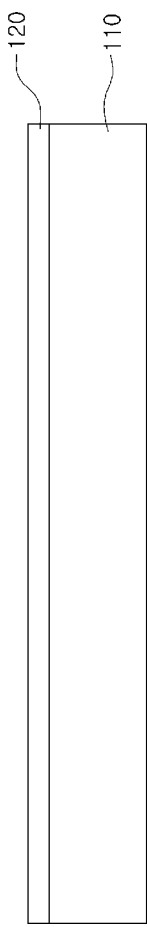
FIGS. 4 through 13 are views illustrating sequential processes in a method of manufacturing the nanostructure semiconductor light emitting device of FIG. 1.

As illustrated in FIG. 4, the first conductivity-type semiconductor material may be grown on the substrate 110 to thereby provide the base layer 120.

The base layer 120 may be provided as a crystal growth surface for light emitting nanostructures, and may be provided as a structure for electrical connections between portions of the light emitting nanostructures 140 having the same polarity. Therefore, as described above, the base layer 120 may be formed as a semiconductor single crystal having electrical conductivity.

The substrate 110 formed of sapphire, SiC, Si, $MgAl_2O_4$, MgO, $LiAlO_2$, $LiGaO_2$, or GaN may be used. The top surface of the substrate 110 may have hemispherical uneven portions. The shape of the uneven portions is not limited thereto, and may be changed. For example, the uneven portions may have triangular, quadrangular or trapezoidal cross-sections. The use of the uneven portions may improve light extraction efficiency and may reduce or prevent defect density. In consideration of these effects, various factors of the uneven portions, such as cross-sectional shape, size and distribution, may be appropriately selected.

The base layer 120 may be formed of a nitride semiconductor containing $Al_xIn_yGa_{1-x-y}N$ (0≤x<1, 0≤y<1, 0≤x+y<1), and may be doped with impurities to have a particular conductivity-type. For example, the base layer 120 may be doped with n-type impurities such as Si. The thickness of the base layer 120 provided for the growth of the nanocores 141a and 141b in a subsequent process may be 1 µm or greater. In consideration of a subsequent electrode formation process or the like, the thickness of the base layer 120 may range from 3 µm to 10 µm. The base layer 120 may include GaN having an n-type impurity concentration of $1\times10^{18}/cm^3$ or higher. A buffer layer may be further formed prior to forming the base layer.

In example embodiments, the substrate 110 may be an Si substrate. In this case, the buffer layer including $Al_yGa_{(1-y)}N$ (0≤y≤1) may be used. For example, the buffer layer may have a structure in which two or more layers having different compositions may be repeatedly stacked. The buffer layer may have a grading structure in which the content of Al is gradually decreased or increased.

Figure 5:
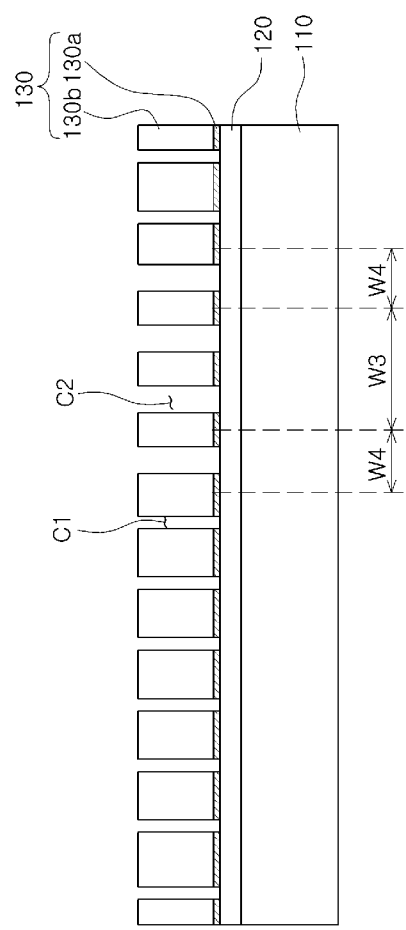

Next, as illustrated in FIG. 5, a mask 130 may be formed on the base layer 120. The mask 130 may have a plurality of openings C1 and C2 and may be provided with an etch stop layer.

The mask 130 used in the present example embodiment may include a first material layer 130a formed on the base layer 120 and a second material layer 130b formed on the first material layer 130a and having a higher etching rate than the first material layer 130a.

The first material layer 130a may be provided as the etch stop layer. That is, the etching rate of the first material layer 130a may be lower than the etching rate of the second material layer 130b under the same etching conditions.

At least the first material layer 130a may be formed of a material having electrical insulating properties, and the second material layer 130b may also be formed of an insulating material as necessary. The first and second material layers 130a and 130b may be formed of different materials to obtain a difference in etching rates. For example, the first material layer 130a may be a SiN layer and the second material layer 130b may be a $SiO_2$ layer. Alternatively, such a difference in etching rates may be obtained using pore density. In example embodiments, the first and second material layers 130a and 130b may be formed of the same insulating material having different porosities.

The overall thickness of the first and second material layers 130a and 130b may be selected in consideration of a desired height of a nanostructure. The thickness of the first material layer 130a may be less than the thickness of the second material layer 130b. An etch stop level through the first material layer 130a may be set to be equal to or lower than ⅓ of the overall height of the mask 130 from the surface of the base layer 120, namely, of the overall thickness of the first and second material layers 130a and 130b.

The overall height of the mask 130, namely, the overall thickness of the first and second material layers 130a and 130b may be equal to or greater than 1 µm, preferably 5 µm to 10 µm. The thickness of the first material layer 130a may be equal to or less than 0.5 µm.

After the first and second material layers 130a and 130b are sequentially formed on the base layer 120, the plurality of openings C1 and C2 may be formed to expose portions of the base layer 120.

The openings C1 and C2 may be formed to have different patterns. Specifically, in the present example embodiment, two groups of openings C1 and C2 may be formed. The diameter of the second group of openings C2 may be greater than the diameter of the first group of openings C1. In addition, distances between the second group of openings C2 may be greater than distances between the first group of openings C1.

An increase in the distances between the openings leads to an increase in amounts of a source gas in contact therewith with respect to the same area, and thus the growth rate of the nanocores 141a and 141b may be relatively increased. An increase in widths of the openings leads to a decrease in amounts of the source gas in contact therewith with respect to the same area, and thus the growth rate of the nanocores 141a and 141b may be relatively lowered.

As the distance between the openings is increased, the thickness of the active layer and/or the second conductivity-type semiconductor layer may also be increased.

The openings C1 and C2 may be manufactured by using a semiconductor process. For example, the openings may be formed to have a high aspect ratio using a deep-etching process. The aspect ratios of the openings C1 and C2 may be equal to or greater than 5, and further equal to or greater than 10. In addition, the aspect ratio of the second group of openings C2 formed in the regions W3 and W3 may be less than the aspect ratio of the first group of openings C1 formed in the regions other than the regions W3 and W3 by at least 10%.

When viewed from the above, the shapes and arrangements of the openings C1 and C2 may be varied. For example, the shapes of the openings C1 and C2 may be polygonal, quadrangular, elliptical, or circular. The arrangements of the openings C1 and C2 may be varied in consideration of pitches between the light emitting nanostructures. As described above, in order to increase the pitch between the light emitting nanostructure 140b to be disposed in the regions W3 and W4, a pitch between the openings C2 formed in the regions W3 and W4 may be greater than a pitch between the openings C1 formed in the region W1.

Figure 6:
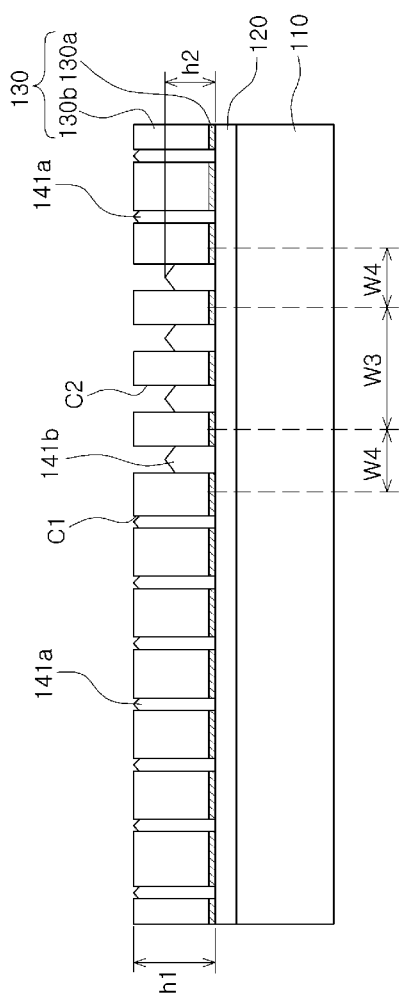

Then, as illustrated in FIG. 6, a first conductivity-type semiconductor material may be grown on the exposed portions of the base layer 120 while filling the plurality of openings C1 and C2, thereby forming the plurality of nanocores 141a and 141b. Due to a difference in the growth rates of the nanocores 141a and 141b resulting from the widths of the openings and the distances between the openings, the nanocores 141a and 141b formed in the groups of openings C1 and C2 may have different heights h1 and h2 according to the groups of openings.

Figure 7:
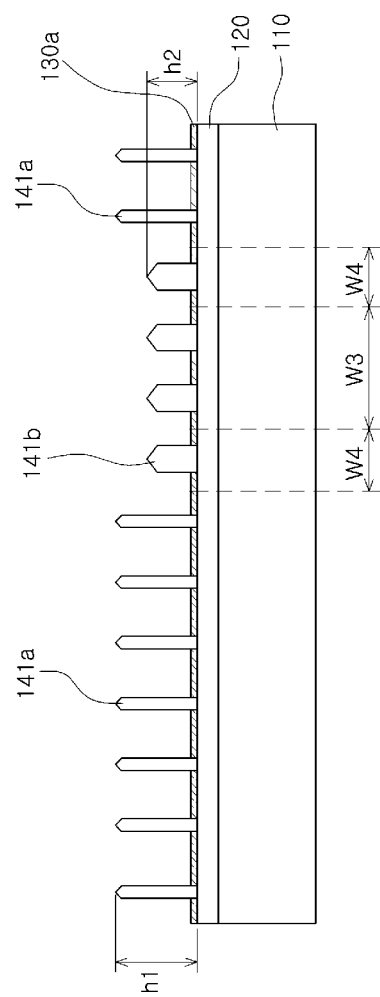

Subsequently, as illustrated in FIG. 7, the mask 130 may be partially removed to the level of the first material layer 130a serving as an etch stop layer to thereby expose portions of the side surfaces of the plurality of nanocores 141a and 141b.

The mask 130 may be removed through a chemical etching process. For example, the second material layer 130b may be removed through a wet-etching process using a buffered oxide etchant (BOE).

In the present example embodiment, by using an etching process of selectively removing the second material layer 130b, only the second material layer 130b may be removed, while the first material layer 130a may be retained. The residual first material layer 130a may serve to reduce or prevent the active layer 142 and the second conductivity-type semiconductor layer 143 from being connected to the base layer 120 in a subsequent growth process.

Figure 8:
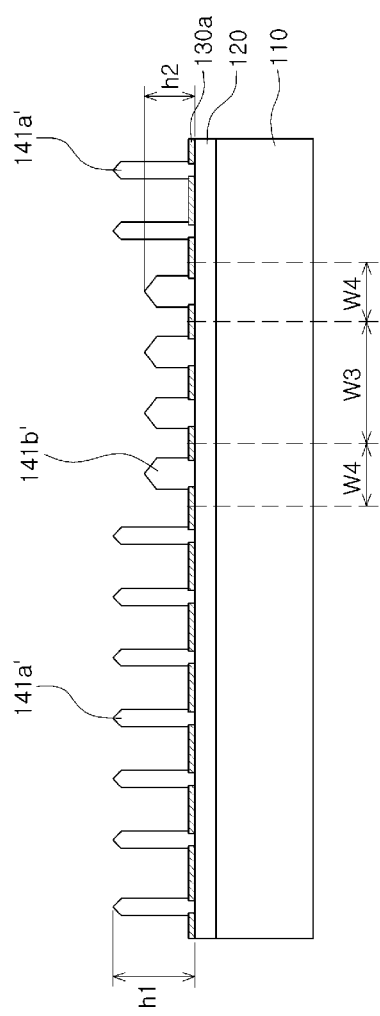

Then, as illustrated in FIG. 8, an additional heat treatment process may be performed to enhance crystallinity of the nanocores 141a and 141b.

After the second material layer 130b is removed from the mask 130, the surfaces of the nanocores 141a and 141b may be heat-treated under predetermined (or alternatively, given) conditions to change a crystal plane of each nanocore into a stable plane advantageous for crystal growth, like a semi-polar or non-polar crystal plane.

The nanocores 141a and 141b may have crystal planes determined depending on the shape of the openings 131. Although differing depending on the shape of the openings, in general, the surfaces of the nanocores 141a and 141b obtained thusly may be relatively unstable crystal planes, which may not be advantageous for subsequent crystal growth.

In the present example embodiment, when the openings have a cylindrical rod shape, the side surfaces of each nanocore 141a and 141b may be curved surfaces, rather than particular crystal planes. When such nanocores 141a and 141b are heat-treated, unstable crystals on the surfaces thereof are rearranged to have stable crystal planes such as semi-polar or non-polar planes. As for heat treatment conditions, the nanocores may be heat-treated at a temperature equal to or higher than 800° C., for a few to tens of minutes to obtain desired stable crystal planes.

For example, when the nanocores 141a and 141b are grown on a C(0001) plane of a sapphire substrate, the nanocores 141a and 141b may be heat-treated at 800° C. or higher to thereby convert the curved surfaces or unstable crystal planes thereof into non-polar planes (m-plane). Stabilization of the crystal planes may be realized through the heat treatment process performed at a high temperature. It may be understood that in a case in which crystals positioned on the surface of the nanocore are rearranged at a high temperature or a source gas remains within a chamber, such a residual source gas is deposited and partial regrowth for obtaining stable crystal planes is performed.

In particular, in view of regrowth, a heat treatment process may be performed under an atmosphere within a chamber in which a residual source gas is present, or may be performed under conditions in which a small amount of source gas is purposely supplied. After the removal of the mask, the heat treatment process may be performed in an MOCVD chamber under conditions similar to those of the growth process of the nanocores, and may enhance the quality of the surfaces of the nanocores. That is, through the heat treatment process, non-uniformities (for example, defects, or the like) present on the surfaces of the nanocores after the removal of the mask may be removed and structural stability (e.g., hexagonal rods) may be enhanced through rearrangement. The heat treatment process may be performed at a temperature similar to the growth temperature of the nanocores, for example, between 800° C. to 1200° C. The size of heat-treated nanocores 141a' and 141b' may be slightly increased.

Figure 9:
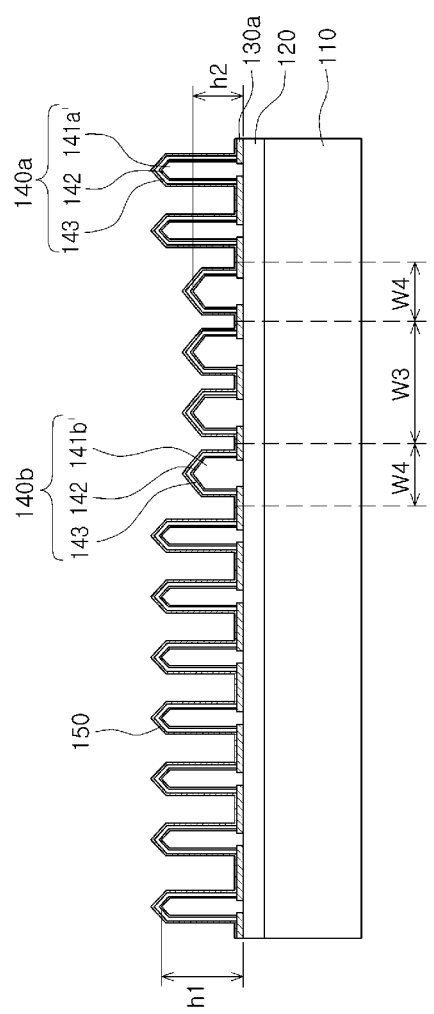

Subsequently, as illustrated in FIG. 9, the active layer 142 and the second conductivity-type semiconductor layer 143 may be sequentially grown on the surfaces of the plurality of nanocores 141a' and 141b'.

Through this process, each of the light emitting nanostructures 140a and 140b may have a core-shell structure including the nanocore 141a' or 141b' formed of the first conductivity-type semiconductor material, and a shell layer formed of the active layer 142 covering the nanocore 141a' or 141b' and the second conductivity-type semiconductor layer 143.

The active layer 142 may have an MQW structure in which quantum well layers and quantum barrier layers are alternately stacked. For example, in the case in which the active layer 142 is formed of a nitride semiconductor, it may have a GaN/InGaN MQW structure or a GaN/AlGaN MQW structure. As necessary, the active layer 142 may have an SQW structure.

The second conductivity-type semiconductor layer 143 may be a crystal containing p-type $Al_xIn_yGa_{1-x-y}N$ ($0 \leq x < 1$, $0 \leq y < 1$, $0 \leq x+y < 1$). The second conductivity-type semiconductor layer 143 may further include a current blocking layer (not shown) in a portion thereof adjacent to the active layer 142. The current blocking layer may have a structure in which a plurality of layers containing n-type $Al_xIn_yGa_{1-x-y}N$ are stacked or one or more layers containing $Al_yGa_{(1-y)}N$ are stacked. The current blocking layer has a higher energy bandgap than the active layer 142, thereby reducing or preventing electrons from moving toward the second conductivity-type (p-type) semiconductor layer 143.

Then, the contact electrode 150 may be formed on the surfaces of the light emitting nanostructures 140a and 140b. The contact electrode 150 may be formed of an ohmic-contact material having ohmic contact with the second conductivity-type semiconductor layers 143. For example, the contact electrode 150 may include at least one of Ag, Ni, Al, Rh, Pd, Ir, Ru, Mg, Zn, Pt, Au, and may be provided as a structure including two or more layers such as Ni/Ag, Zn/Ag, Ni/Al, Zn/Al, Pd/Ag, Pd/Al, Ir/Ag. Ir/Au, Pt/Ag, or Pt/Al, Ni/Ag/Pt. Alternatively, the contact electrode 150 may include a transparent electrode material such as ITO. In example embodiments, graphene may also be used.

Figure 10:
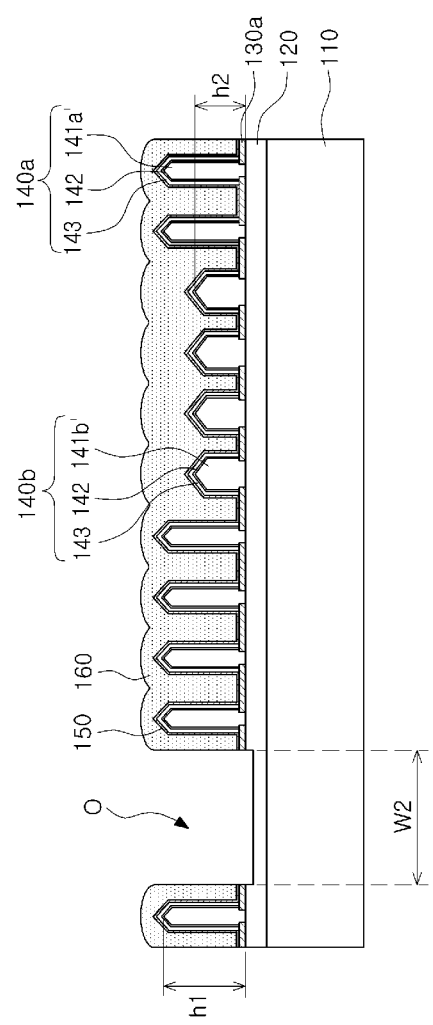

Then, as illustrated in FIG. 10, the insulating protective layer 160 may be formed to cover the light emitting nanostructures 140a and 140b, and the region W2 in which the first electrode is to be formed may be defined.

The insulating protective layer 160 may be formed of an electrical insulating material that is able to provide a passivation structure through a semiconductor process. An insulating protective layer formed of $SiO_2$ or $SiN_x$ may be used therefor. For example, the insulating protective layer 160 may be formed of TEOS, BPSG, CVD-$SiO_2$, SOG, or SOD, so as to fill the spaces between the light emitting nanostructures with ease. In the present example embodiment, TEOS may be used.

The region W2 in which the first electrode is to be formed may be defined by removing a portion of the base layer 120 and exposing a corresponding recessed portion O. The recessed portion O may be used in disposing the first electrode in a subsequent process. Such a removal process may be performed by using a photolithography process.

Figure 11:
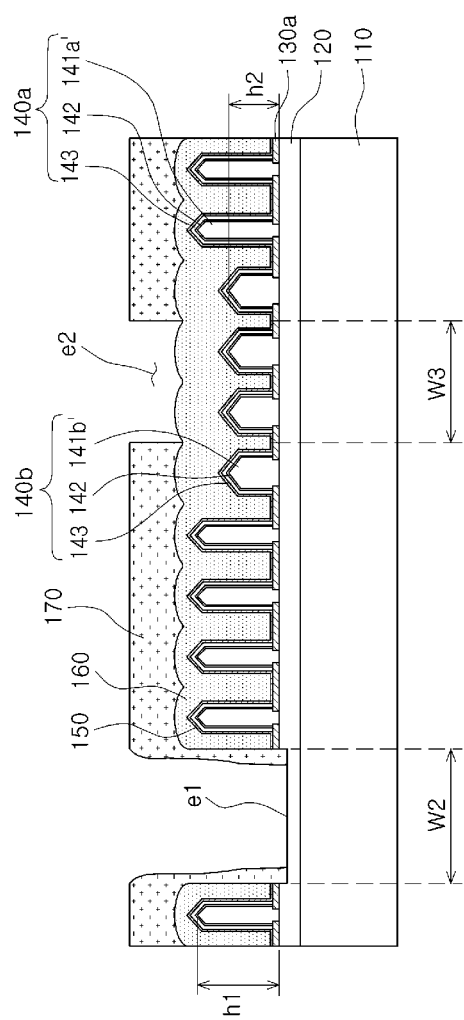
Figure 12:
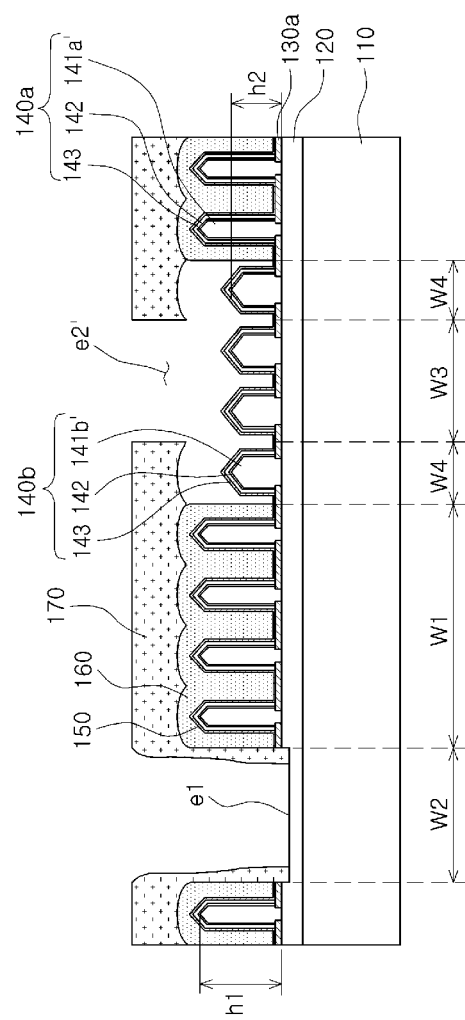

Then, as illustrated in FIG. 11, a photoresist 170 may be applied to cover the insulating protective layer 160, and may be selectively etched to form recesses e1 and e2 in which the first and second electrodes are to be formed. Such an etching process may be performed through dry etching such as $CF_4$ plasma etching or $O_2$ plasma etching. Subsequently, as illustrated in FIG. 12, a portion of the insulating protective layer 160 exposed through the recess e2 may be selectively removed to expose the region W3 in which the second electrode is to be formed. In a case in which the insulating protective layer 160 is formed of TEOS, the insulating protective layer 160 may be selectively removed through a wet-etching process using a BOE. However, due to the wet-etching characteristics, the region W3 in which the second electrode is to be formed may not only be etched, but a peripheral region may also be etched to form an enlarged recess e2' in the region W4. Such an enlarged recess may be formed to have a predetermined (or alternatively, given) width around the region W3 in which the second electrode is to be formed, and the predetermined (or alternatively, given) width of the recess may be less than approximately 5 µm.

In the present example embodiment, the light emitting nanostructures 140b disposed in the region W4 may be formed to have high impact-resistance so as to not be vulnerable to external impact even after the removal of the insulating protective layer 160 around the light emitting nanostructures 140b. Therefore, even in a case in which external impact is applied thereto in a subsequent process, damage to the light emitting nanostructures 140b may be reduced or prevented.

Figure 13:
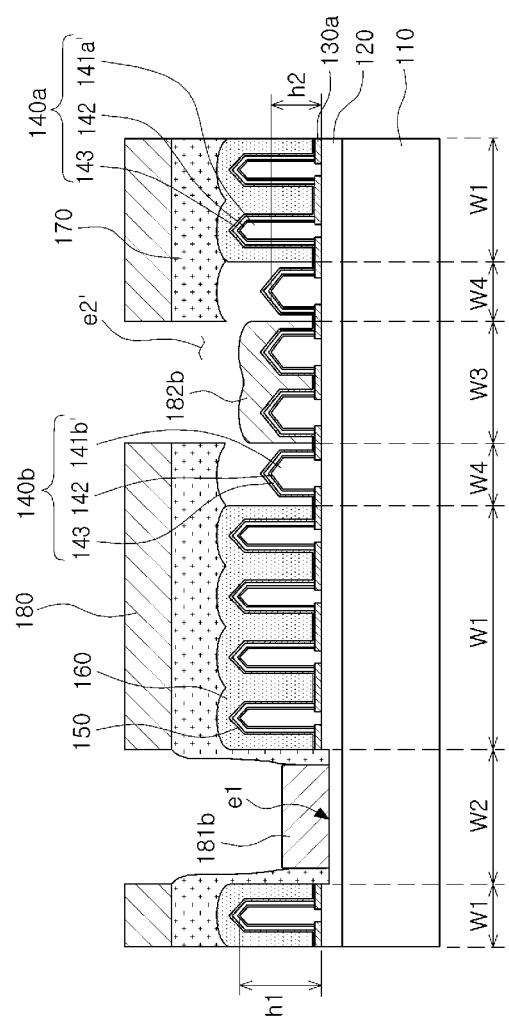

Then, as illustrated in FIG. 13, a metal layer 180 may be deposited to thereby form the first and second electrodes 181b and 182b. The first and second electrodes 181b and 182b in the present process may be formed of a common electrode material. For example, the material for the first and second electrodes 181b and 182b may include Au, Ag, Al, Ti, W, Cu, Sn, Ni, Pt, Cr, Sn, TiW, AuSn or a eutectic metal thereof.

At this time, the metal layer 180 is not deposited on the light emitting nanostructures 140b disposed in the region W4, and thus the second electrode 182b is not formed on the light emitting nanostructures 140b disposed in the region W4. Conventionally, nanostructures similar to the light emitting nanostructures 140b disposed in the region W4 have been easily broken during the removal of the metal layer and the photoresist. In the present example embodiment, the light emitting nanostructures 140b disposed in the region W4 are formed to be more resistant to external impact as compared with the nanostructures disposed in the region W1, and thus, even when an external impact is applied thereto during the removal of the photoresist 170, the breakage of the light emitting nanostructures 140b disposed in the region W4 may be reduced or prevented.

The nanostructure semiconductor light emitting device according to the above-described example embodiment may be used in various types of package.

As set forth above, in example embodiments, one or more components of the light emitting structures in one or more regions may have different shapes; for example, different sizes, different diameters, different heights, different thicknesses, different aspect ratios, different pitches, and/or different concentrations, of, for example, Indium (In).

Figure 14:
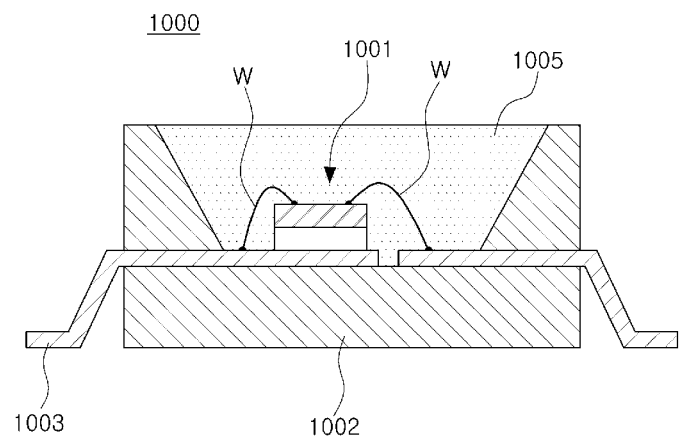
FIGS. 14 and 15 are cross-sectional views illustrating examples of a package including a nanostructure semiconductor light emitting device according to an example embodiment in the present disclosure.

A semiconductor light emitting device package 1000 illustrated in FIG. 14 may include a semiconductor light emitting device 1001, a package body 1002, and a pair of lead frames 1003. The semiconductor light emitting device 1001 may be the nanostructure semiconductor light emitting device 100 of FIG. 1, and details thereof will be omitted.

The semiconductor light emitting device 1001 may be mounted on the pair of lead frames 1003 to be electrically connected to the pair of lead frames 1003 through wires W.

As necessary, the semiconductor light emitting device 1001 may be mounted on a different region, for example, on the package body 1002, rather than on the pair of lead frames 1003. Also, the package body 1002 may have a cup shape to improve reflectivity efficiency of light. An encapsulation body 1005 formed of a light-transmissive material may be formed in the reflective cup to encapsulate the semiconductor light emitting device 1001, the wires W, and the like.

Figure 15:
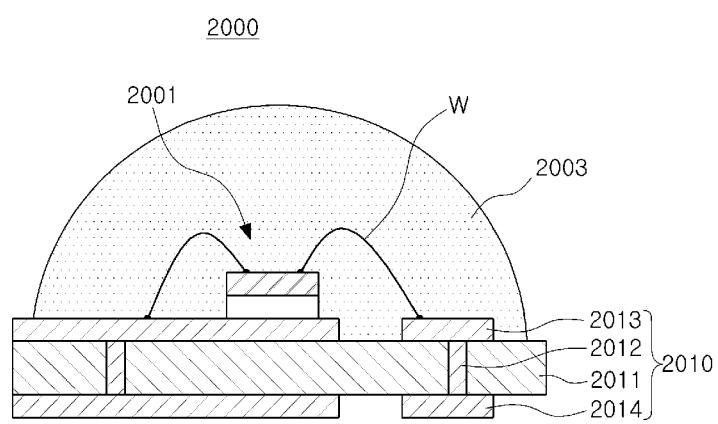

A semiconductor light emitting device package 2000 illustrated in FIG. 15 may include a semiconductor light emitting device 2001, a mounting board 2010, and an encapsulation body 2003. The semiconductor light emitting device 2001 may be the nanostructure semiconductor light emitting device 100 of FIG. 1, and details thereof will be omitted.

A wavelength conversion part may be formed on the surface of the semiconductor light emitting device 2001. The semiconductor light emitting device 2001 may be mounted on the mounting board 2010 to be electrically connected to the mounting board 2010 through wires W.

The mounting board 2010 may include a body 2011, an upper electrode 2013, a lower electrode 2014, and a through electrode 2012 connecting the upper electrode 2013 and the lower electrode 2014. The mounting board 2010 may be aboard such as a printed circuit board (PCB), a metal core printed circuit board (MCPCB), a metal printed circuit board (MPCB), a flexible printed circuit board (FPCB), or the like, and the structure of the mounting board 2010 may be modified to have various forms.

The encapsulation body 2003 may be formed to have a lens structure of which a top surface has a convex dome shape. However, according to example embodiments, the encapsulation body 2003 may have a lens structure having a convex or concave surface to adjust an angle of light emitted through the top surface of the encapsulation body 2003.

The nanostructure semiconductor light emitting device and the packages including the same according to the above-described example embodiments may be usefully applied to various products.

Figure 16:
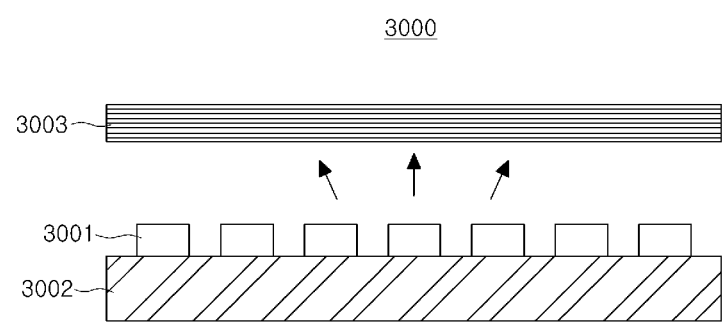
FIGS. 16 and 17 are cross-sectional views illustrating examples of a backlight unit including a nanostructure semiconductor light emitting device according to an example embodiment in the present disclosure.
Figure 17:
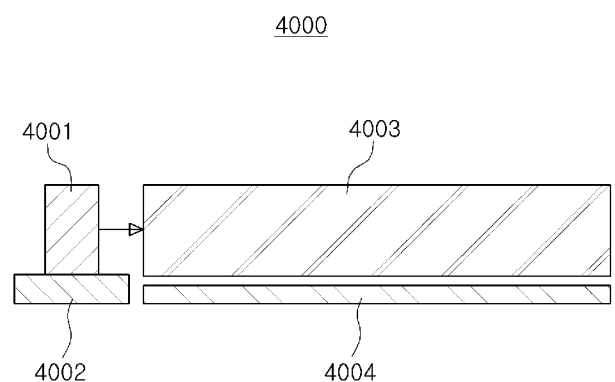

FIGS. 16 and 17 are cross-sectional views illustrating examples of a backlight unit including a nanostructure semiconductor light emitting device according to an example embodiment in the present disclosure.

With reference to FIG. 16, a backlight unit 3000 may include at least one light source 3001 mounted on a board 3002 and at least one optical sheet 3003 disposed thereabove. The light source 3001 may have the same structure as that of the aforementioned nanostructure semiconductor light emitting device or a structure similar thereto. In addition, the nanostructure semiconductor light emitting device may be directly mounted on the board 3002, which is called a chip-on-board (COB) type structure.

The light source 3001 in the backlight unit 3000 of FIG. 16 emits light toward a liquid crystal display (LCD) device disposed thereabove, whereas a light source 4001 mounted on a board 4002 in a backlight unit 4000 according to another example embodiment illustrated in FIG. 17 emits light laterally and the light is incident to a light guide plate 4003 such that the backlight unit 4000 may serve as a surface light source. The light travelling to the light guide plate 4003 may be emitted upwardly and a reflective layer 4004 may be formed below a bottom surface of the light guide plate 4003 in order to improve light extraction efficiency.

Figure 18:
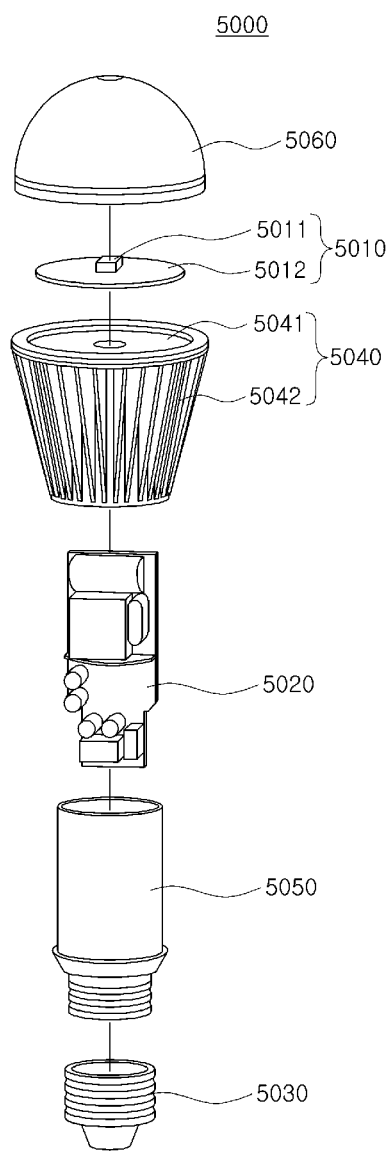
FIGS. 18 and 19 are views illustrating examples of a lighting device including a nanostructure semiconductor light emitting device according to an example embodiment in the present disclosure.
Figure 19:
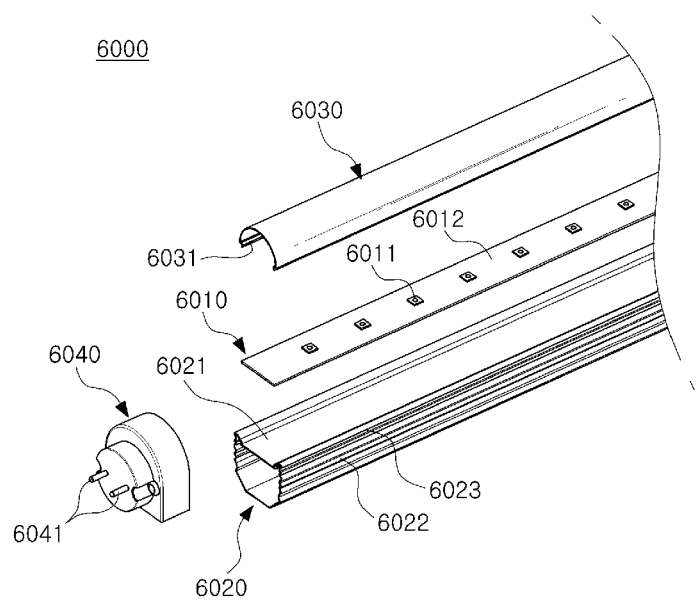

FIGS. 18 and 19 are exploded perspective views illustrating examples of a lighting device including a nanostructure semiconductor light emitting device according to an example embodiment in the present disclosure.

A lighting device 5000 of FIG. 18 is exemplified as a bulb-type lamp, and may include a light emitting module 5010, a driver 5020 and an external connector 5030. In addition, the lighting device 5000 may further include exterior structures such as external and internal housings 5040 and 5050, a cover 5060, and the like.

The light emitting module 5010 may include a light source 5011 having the same structure as that of the aforementioned nanostructure semiconductor light emitting device 100, or a structure similar thereto, and a circuit board 5012 having the light source 5011 mounted thereon. In the present example embodiment, a single light source 5011 is mounted on the circuit board 5012 by way of example; however, a plurality of light sources may be mounted thereon as necessary. Instead of being directly mounted on the circuit board 5012, the light source 5011 may be manufactured as a package and the package may be mounted on the circuit board 5012.

The external housing 5040 may serve as a heat radiator and may include a heat sink plate 5041 directly contacting the light emitting module 5010 to thereby improve heat dissipation and heat radiating fins 5042 surrounding the heat sink plate 5041 and aside surface of the external housing 5040. The cover 5060 may be disposed above the light emitting module 5010 and have a convex lens shape. The driver 5020 may be disposed inside the internal housing 5050 and be connected to the external connector 5030 serving as a socket structure to receive power from an external power source. In addition, the driver 5020 may convert the received power into power appropriate for driving the light source 5011 of the light emitting module 5010 and supply the converted power thereto. For example, the driver 5020 may be provided as an AC-DC converter, a rectifying circuit, or the like.

In addition, although not shown, the lighting device 5000 may further include a communications module.

With reference to FIG. 19, a lighting device 6000 is exemplified as a bar-type lamp, and may include a light emitting module 6010, a body 6020, a cover 6030 and a terminal 6040.

The light emitting module 6010 may include a board 6012 and a plurality of light sources 6011 mounted on the board 6012. The light source 6011 may have the same structure as that of the aforementioned nanostructure semiconductor light emitting device 100 of FIG. 1 or the semiconductor light emitting device packages 1000 and 2000 of FIGS. 14 and 15, or a structure similar thereto.

The body 6020 may have a recess 6021 to which the light emitting module 6010 is fixed, and may dissipate heat generated in the light emitting module 6010 externally. Therefore, the body 6020 may include a heat sink as a support structure, and a plurality of heat radiating fins 6022 for dissipating heat may be protruded on both side surfaces of the body 6020.

The cover 6030 may be coupled to a groove 6023 of the body 6020, and may have a semispherical curved surface so as to uniformly irradiate light externally. A protrusion 6031 may be formed on a bottom surface of the cover 6030 in a length direction thereof so that the protrusion 6031 is engaged to the groove 6023.

The terminal 6040 may be disposed on at least one open end of the body 6020 in a length direction thereof to supply power to the light emitting module 6010, and may include an electrode pin 6041 protruded externally.

As set forth above, according to example embodiments in the present disclosure, the breakage of the light emitting nanostructures may be reduced or prevented during the manufacturing of the nanostructure semiconductor light emitting device, thereby avoiding an increase in leakage current. In addition, an increase in the operating voltage of the nanostructure semiconductor light emitting device may be reduced or prevented.

Additionally, each of the features described above may be combined in any appropriate manner to obtain nanostructure semiconductor light emitting devices, light emitting nanostructures, methods, and/or apparatuses with various combinations of features. In this regard, U.S. application Ser. No. 14/551,978, filed Nov. 24, 2014; Ser. No. 14/723,869, filed May 28, 2015; Ser. No. 13/599,430, filed Aug. 30, 2012; Ser. No. 14/501,232, filed Sep. 30, 2014; U.S. application Ser. No. 14/828,004, filed Aug. 17, 2015; U.S. application Ser. No. 14/833,832, filed Aug. 24, 2015; and U.S. application Ser. No. 14/838,322, filed on Aug. 27, 2015 are each hereby incorporated by reference in their entirety, thereby disclosing additional nanostructure semiconductor light emitting devices, light emitting nanostructures, methods, and/or apparatuses with various additional combinations of features.

While example embodiments have been shown and described above, it will be apparent to those skilled in the art that modifications and variations could be made without departing from the scope in the present invention as defined by the appended claims.

What is claimed is:

1. A nanostructure semiconductor light emitting device, comprising:
   a base layer having first and second regions and formed of a first conductivity-type semiconductor material;
   a plurality of light emitting nanostructures on the base layer, each of which including a nanocore formed of a first conductivity-type semiconductor material, and an active layer and a second conductivity-type semiconductor layer on the nanocore;
   a contact electrode on the plurality of light emitting nanostructures to be electrically connected to the second conductivity-type semiconductor layer;
   a first electrode electrically connected to the base layer;
   a second electrode covering a portion of the contact electrode on at least one of light emitting nanostructures in the second region among the plurality of light emitting nanostructures; and
   an insulating protective layer on the first region, the insulating protective layer filling spaces between each of the plurality of light emitting nanostructures in the first region, each of the light emitting nanostructures in the second region being exposed from the insulating protective layer;
   wherein the light emitting nanostructures in the second region have a greater impact resistance than the light emitting nanostructures in the first region.

2. The nanostructure semiconductor light emitting device of claim 1, wherein the light emitting nanostructures in the second region have a larger diameter than the light emitting nanostructures in the first region.

3. The nanostructure semiconductor light emitting device of claim 1, wherein the light emitting nanostructures in the second region are shorter than the light emitting nanostructures in the first region.

4. The nanostructure semiconductor light emitting device of claim 3, wherein the light emitting nanostructures in the second region have a larger pitch than the light emitting nanostructures in the first region.

5. The nanostructure semiconductor light emitting device of claim 1, wherein the light emitting nanostructures in the second region have a lower aspect ratio than the light emitting nanostructures in the first region.

6. The nanostructure semiconductor light emitting device of claim 5, wherein the aspect ratio of the light emitting nanostructures in the second region is less than the aspect ratio of the light emitting nanostructures in the first region by at least 10%.

7. The nanostructure semiconductor light emitting device of claim 1, wherein the second region includes a region covered with the second electrode and a peripheral region adjacent thereto.

8. The nanostructure semiconductor light emitting device of claim 7, wherein the peripheral region has a width around the region covered with the second electrode.

9. The nanostructure semiconductor light emitting device of claim 8, wherein the width is less than approximately 5 μm.

10. The nanostructure semiconductor light emitting device of claim 7, wherein light emitting nanostructures in the peripheral region have a smaller diameter than the light emitting nanostructures in the region covered with the second electrode.

11. The nanostructure semiconductor light emitting device of claim 7, wherein light emitting nanostructures in the peripheral region are shorter than the light emitting nanostructures in the region covered with the second electrode.

12. The nanostructure semiconductor light emitting device of claim 1, wherein at least one of the light emitting nanostructures in the second region is exposed from both the insulating protective layer and the second electrode.

13. The nanostructure semiconductor light emitting device of claim 1, wherein an active layer of each of the light emitting nanostructures in the second region is thinner than an active layer of each of the light emitting nanostructures in the first region.

14. The nanostructure semiconductor light emitting device of claim 1, wherein a second conductivity-type semiconductor layer of each of the light emitting nanostructures in the second region is thicker than a second conductivity-type semiconductor layer of each of the light emitting nanostructures in the first region.

15. A nanostructure semiconductor light emitting device, comprising:
a base layer formed of a first conductivity-type semiconductor material and having a first region and a second region around the first region and spaced apart from the first region;
a plurality of light emitting nanostructures on the base layer spaced apart from each other, each of which including a nanocore formed of a first conductivity-type semiconductor material, and an active layer and a second conductivity-type semiconductor layer on the nanocore, the plurality of light emitting nanostructures including light emitting nanostructures in the first region and light emitting nanostructures in the second region;
a contact electrode on the plurality of light emitting nanostructures;
a first electrode electrically connected to the base layer;
a second electrode covering a portion of the contact electrode corresponding to the first region; and
an insulating protective layer on the first region, the insulating protective layer filling spaces between each of the light emitting nanostructures in the first region, each of the light emitting nanostructures in the second region being exposed from the insulating protective layer;
wherein the light emitting nanostructures in the second region have a greater impact resistance than light emitting nanostructures in the first region.

16. A nanostructure semiconductor light emitting device, comprising:
a base layer including first and second regions;
a plurality of light emitting nanostructures on an upper surface of the base layer, the plurality of light emitting nanostructures including light emitting nanostructures in the first region and light emitting nanostructures in the second region;
a contact electrode on the plurality of light emitting nanostructures; and
an insulating protective layer on the first region, the insulating protective layer filling spaces between each of the light emitting nanostructures in the first region, each of the light emitting nanostructures in the second region being exposed from the insulating protective layer;
wherein the light emitting nanostructures in the second region have a greater impact resistance than the light emitting nanostructures in the first region.

17. The nanostructure semiconductor light emitting device of claim 16, wherein the light emitting nanostructures in the second region have a lower aspect ratio than the light emitting nanostructures in the first region.

18. The nanostructure semiconductor light emitting device of claim 16, wherein an active layer of each of the light emitting nanostructures in the second region is thinner than an active layer of each of the light emitting nanostructures in the first region.

19. The nanostructure semiconductor light emitting device of claim 16, wherein a conductivity-type semiconductor layer of each of the light emitting nanostructures in the second region is thicker than a conductivity-type semiconductor layer of each of the light emitting nanostructures in the first region.

* * * * *